United States Patent
Ostrom et al.

(10) Patent No.: US 8,558,553 B2
(45) Date of Patent: Oct. 15, 2013

(54) METHODS AND APPARATUS FOR SELECTING SETTINGS FOR CIRCUITS

(75) Inventors: Kenneth A. Ostrom, Palos Verdes Estates, CA (US); Richard Pierson, Newport Beach, CA (US); Benjamim Tang, Rancho Palos Verdes, CA (US); Clark Custer, Torrance, CA (US); Scott Southwell, Seal Beach, CA (US); Felix Kim, Plano, TX (US)

(73) Assignee: Infineon Technologies Austria AG, Villach (AT)

( * ) Notice: Subject to any disclaimer, the term of this patent is extended or adjusted under 35 U.S.C. 154(b) by 820 days.

(21) Appl. No.: 12/639,187

(22) Filed: Dec. 16, 2009

(65) Prior Publication Data

US 2010/0148795 A1    Jun. 17, 2010

Related U.S. Application Data

(60) Provisional application No. 61/122,926, filed on Dec. 16, 2008.

(51) Int. Cl.
    *G01R 31/02*    (2006.01)
(52) U.S. Cl.
    USPC .............. 324/537; 324/750.03; 324/762.02; 324/713; 702/64; 702/65
(58) Field of Classification Search
    USPC .......... 324/750.03, 762.02, 713, 537; 702/64, 702/65
    See application file for complete search history.

(56) References Cited

U.S. PATENT DOCUMENTS

| | | | | |
|---|---|---|---|---|
| 3,725,685 A * | 4/1973 | Bourgoin et al. | ............... | 702/65 |
| 3,978,402 A * | 8/1976 | Ryder | .......... | 324/607 |
| 4,196,475 A * | 4/1980 | Hall | ............... | 702/65 |
| 4,342,089 A * | 7/1982 | Hall | ............... | 702/64 |
| 4,471,308 A * | 9/1984 | Gable et al. | .............. | 324/416 |
| 4,723,105 A * | 2/1988 | Matouka et al. | ............. | 320/123 |
| 5,025,204 A * | 6/1991 | Su | .............. | 323/274 |
| 5,221,905 A * | 6/1993 | Bhangu et al. | ............. | 324/713 |
| 5,483,173 A * | 1/1996 | Pellegrini | ............. | 324/762.02 |
| 6,122,296 A * | 9/2000 | Shih | ............ | 370/532 |
| 6,392,392 B1 * | 5/2002 | Nakahara | ............. | 323/312 |
| 6,894,501 B1 * | 5/2005 | Flasck et al. | ............. | 324/416 |
| 6,897,662 B2 * | 5/2005 | Kunst et al. | ............. | 324/713 |
| 7,076,384 B1 * | 7/2006 | Radulov et al. | ............. | 702/85 |
| 7,319,346 B2 * | 1/2008 | Shyr et al. | ............. | 327/103 |
| 7,327,150 B2 * | 2/2008 | Kumar et al. | ............. | 324/691 |
| 7,385,410 B2 * | 6/2008 | Payman | ............. | 324/762.03 |
| 7,495,451 B2 * | 2/2009 | Krouth et al. | ............. | 324/522 |
| 7,589,540 B2 * | 9/2009 | Nam et al. | ............. | 324/713 |
| 7,719,293 B2 * | 5/2010 | Farkas | ............. | 324/713 |
| 7,859,287 B2 * | 12/2010 | An et al. | ............. | 324/762.02 |
| 7,960,985 B2 * | 6/2011 | Wong et al. | ............. | 324/750.3 |
| 8,193,796 B2 * | 6/2012 | Tang et al. | ............. | 323/283 |

(Continued)

*Primary Examiner* — Arleen M Vazquez
*Assistant Examiner* — Lamarr Brown
(74) *Attorney, Agent, or Firm* — Murphy, Bilak & Homiller, PLLC

(57) ABSTRACT

Methods and apparatus selecting settings for circuits according to various aspects of the present invention may operate in conjunction with a measurement element connected to the circuit. The circuit may include a voltage source adapted to supply a voltage to the measurement element. The voltage may be substantially independent of the characteristics of the measurement element. The circuit may further include a measurement sensor responsive to a current in the measurement element. The measurement sensor may generate a control signal according to the current in the measurement element.

17 Claims, 9 Drawing Sheets

(56) References Cited

U.S. PATENT DOCUMENTS

| | | | |
|---|---|---|---|
| 8,208,287 B2* | 6/2012 | Chevallier et al. | 365/148 |
| 8,405,407 B2* | 3/2013 | Edwards et al. | 324/679 |
| 2002/0075012 A1* | 6/2002 | Tang et al. | 324/614 |
| 2002/0097098 A1* | 7/2002 | Tang | 331/57 |
| 2002/0169571 A1* | 11/2002 | DeCaro et al. | 702/64 |
| 2002/0190734 A1* | 12/2002 | Burt et al. | 324/713 |
| 2003/0011422 A1* | 1/2003 | Bazes | 327/540 |
| 2003/0025514 A1* | 2/2003 | Benes | 324/713 |
| 2003/0067314 A1* | 4/2003 | Kaukko | 324/754 |
| 2004/0081146 A1* | 4/2004 | Tang et al. | 370/370 |
| 2005/0071098 A1* | 3/2005 | Iannone et al. | 702/65 |
| 2005/0231406 A1* | 10/2005 | Flasck et al. | 341/124 |
| 2006/0020406 A1* | 1/2006 | Takakamo et al. | 702/64 |
| 2006/0038578 A1* | 2/2006 | Hashimoto | 324/765 |
| 2006/0089814 A1* | 4/2006 | Tzeng et al. | 702/64 |
| 2007/0080696 A1* | 4/2007 | Kumar et al. | 324/691 |
| 2007/0205778 A1* | 9/2007 | Fabbro et al. | 324/713 |
| 2007/0257650 A1* | 11/2007 | Southwell et al. | 323/283 |
| 2008/0084222 A1* | 4/2008 | Yen | 324/713 |
| 2008/0111576 A1* | 5/2008 | Shyr et al. | 324/765 |
| 2008/0174260 A1* | 7/2008 | D'Angelo et al. | 318/650 |
| 2008/0234957 A1* | 9/2008 | Banhegyesi et al. | 702/64 |
| 2009/0109586 A1* | 4/2009 | Scheikl et al. | 361/83 |
| 2009/0121729 A1* | 5/2009 | Farkas | 324/713 |
| 2009/0146643 A1* | 6/2009 | Ostrom et al. | 324/123 R |
| 2009/0167271 A1* | 7/2009 | Tang et al. | 323/283 |
| 2009/0171602 A1* | 7/2009 | Hong | 702/65 |
| 2009/0189592 A1* | 7/2009 | Wong et al. | 324/76.11 |
| 2009/0224731 A1* | 9/2009 | Tang et al. | 323/241 |
| 2009/0224733 A1* | 9/2009 | Tang et al. | 323/272 |
| 2009/0224734 A1* | 9/2009 | Tang et al. | 323/272 |
| 2009/0261795 A1* | 10/2009 | Tang et al. | 323/283 |
| 2009/0261798 A1* | 10/2009 | Sachdev et al. | 323/288 |
| 2009/0322358 A1* | 12/2009 | Imaizumi | 324/713 |
| 2010/0013452 A1* | 1/2010 | Tang et al. | 323/282 |
| 2010/0073990 A1* | 3/2010 | Siau et al. | 365/148 |
| 2010/0166132 A1* | 7/2010 | Tang et al. | 375/372 |
| 2010/0250165 A1* | 9/2010 | Notohamiprodjo et al. | 702/64 |
| 2011/0084678 A1* | 4/2011 | Tang et al. | 323/284 |
| 2011/0169493 A1* | 7/2011 | Notohamiprodjo et al. | 324/403 |
| 2011/0260537 A1* | 10/2011 | Tang et al. | 307/55 |
| 2011/0267871 A1* | 11/2011 | Siau et al. | 365/148 |
| 2012/0078555 A1* | 3/2012 | Banhegyesi et al. | 702/64 |
| 2012/0123713 A1* | 5/2012 | Notohamiprodjo et al. | 702/64 |

* cited by examiner

METHODS AND APPARATUS FOR SELECTING SETTINGS FOR CIRCUITS

CROSS-REFERENCES TO RELATED APPLICATIONS

This application claims the benefit of U.S. Provisional Patent Application No. 61/122,926, filed Dec. 16, 2008, and incorporates the disclosure of such application by reference.

BACKGROUND OF INVENTION

Many integrated circuits provide functions with multiple settings that can be selected, such as after the integrated circuit has been placed on a printed circuit board or otherwise secured. Conventional methods may use digital mechanisms for selecting the settings. The integrated circuit pin may have two states (logic high or logic low) or three states (logic high, a mid voltage state and a logic low state). Various systems have been deployed using resistor-based circuits for selecting one of multiple settings in conjunction with a direct current be applied to the terminal of the integrated circuit to flow through the measurement resistor with a subsequent quantizing of the voltage produced.

SUMMARY OF THE INVENTION

Methods and apparatus for selecting settings for circuits according to various aspects of the present invention may operate in conjunction with a measurement element connected to the circuit. The circuit may include a voltage source adapted to supply a voltage to the measurement element. The voltage may be substantially independent of the characteristics of the measurement element. The circuit may further include a measurement sensor responsive to a current in the measurement element. The measurement sensor may generate a control signal according to the current in the measurement element.

BRIEF DESCRIPTION OF THE DRAWINGS

A more complete understanding of the present invention may be derived by referring to the detailed description and claims when considered in connection with the following illustrative figures. In the following figures, like reference numbers refer to similar elements and steps throughout the figures.

Elements and steps in the figures are illustrated for simplicity and clarity and have not necessarily been rendered according to any particular sequence. For example, steps that may be performed concurrently or in different order are illustrated in the figures to help to improve understanding of embodiments of the present invention.

DETAILED DESCRIPTION OF EXEMPLARY EMBODIMENTS

The present invention may be described in terms of functional block components and various processing steps. Such functional blocks may be realized by any number of hardware or software components configured to perform the specified functions and achieve the various results. For example, the present invention may employ various resistors, voltage supplies, measurement sensors, and the like, which may carry out a variety of functions. In addition, the present invention may be practiced in conjunction with any number of circuits and systems, and the integrated circuit system described is merely one exemplary application for the invention. Further, the present invention may employ any number of techniques for generating voltages; measuring currents, generating signals, and the like, such as disclosed in U.S. Pat. Nos. 6,894,501 and 7,091,736 to Flasck et al. and 6,122,296 to Shih.

Figure 1:
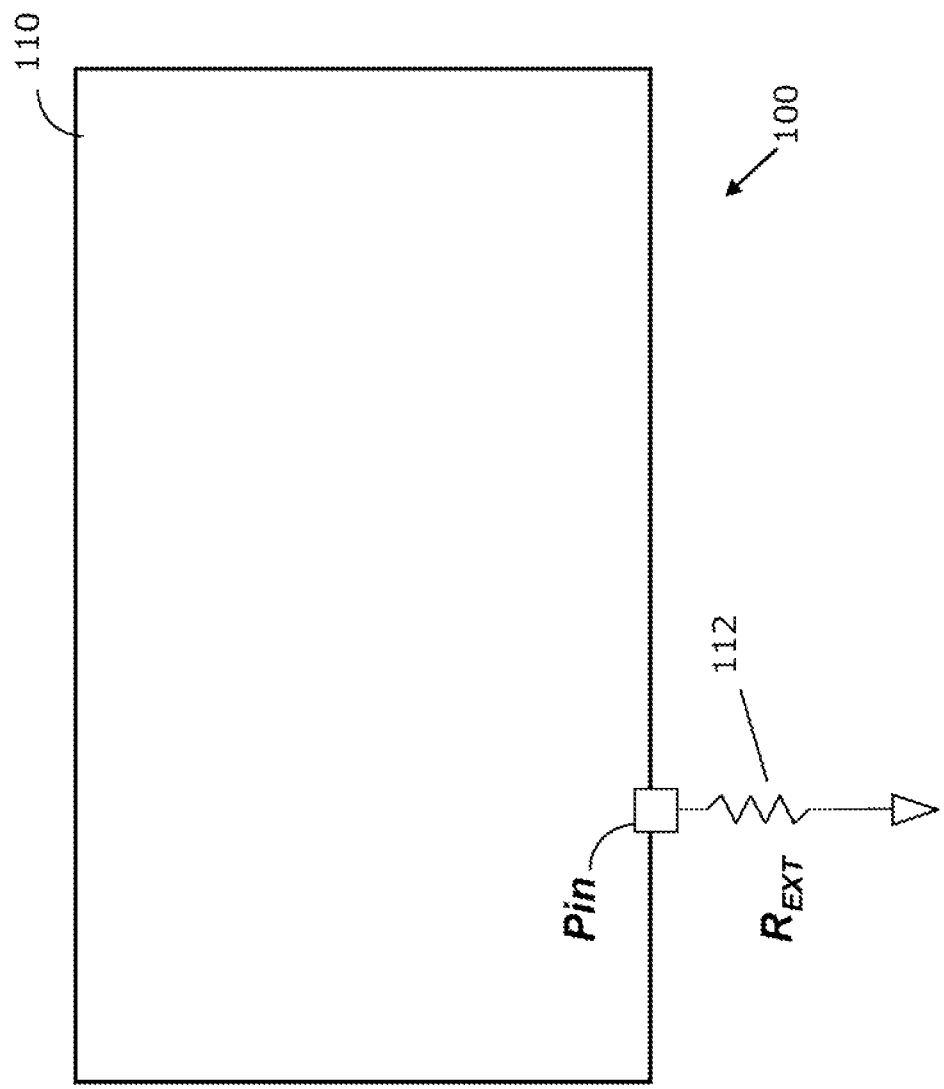
FIG. 1 representatively illustrates an electronic system comprising an integrated circuit and a measurement element.

Methods and apparatus for selecting settings for a circuit according to various aspects of the present invention may operate in conjunction with an electronic system including integrated circuits. Referring now to FIG. 1, an exemplary electronic system 100 may comprise a component, such as an integrated circuit 110 or the like, and a measurement element 112. Selecting a measurement element 112 having particular characteristics determines a particular setting for the integrated circuit 110.

For example, the integrated circuit 110 may be adapted to operate in conjunction with multiple settings, such as more than two settings, more than three settings, or more than four settings. The integrated circuit 110 may comprise any appropriate integrated circuit that operates in conjunction with different settings according to signals that may be selectively adjusted. In one embodiment, the integrated circuit 110 comprises a switching voltage regulator. The settings may designate any suitable characteristics, such as operational modes, operating environments, switching frequencies, set points, droop levels, digital compensation modes, or other user-selectable settings. An example of a selected setting may be a bus address value for the integrated circuit 110 to uniquely distinguish the integrated circuit 110 from other integrated circuits sharing the digital bus.

The integrated circuit 110 may include a functional module 108 and/or other circuits that receive a control signal corresponding to a quantized state and determine the desired setting based on the quantized state. The integrated circuit may be adapted to provide multiple control signals to various functional modules 108 or other circuits. The functional module 108 implements the selected setting represented by the control signal.

The setting of the integrated circuit 110 may be determined according to the measurement element 112. The measurement element 112 controls the setting used by the integrated circuit 110, and the measurement element 112 may be selected according to the desired setting. For example, the measurement element 112 may comprise a single resistor, and the resistance of the resistor may be selected according to the desired setting. In one embodiment, the resistor may have a range of resistance values representing different settings, such as from about 1K ohms to 10K ohms. A suitable resistor may be a variable-resistance resistor or a resistor selected from an array of resistors having different values. The measurement element 112 may, however, comprise any appropriate element that may be varied according to the desired selection. For example, the measurement element 112 may be implemented as one or more resistors, capacitors, inductors, current sources, voltage sources, and the like.

The measurement element 112 may communicate with the integrated circuit 110 or other elements in any suitable manner to communicate the desired setting. In the present embodiment, the measurement element 112 is coupled to the integrated circuit 110 via a conventional terminal, such as a pin or pad.

Figure 2:
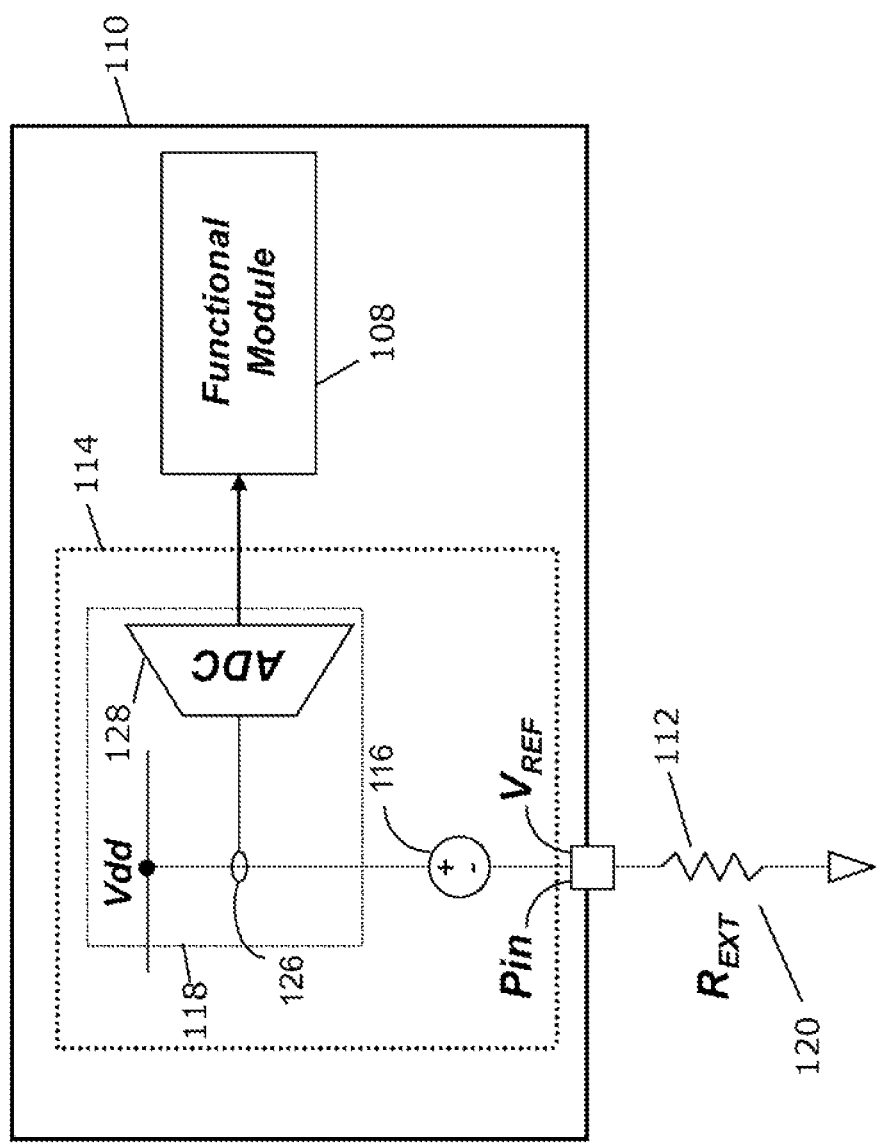
FIG. 2 illustrates an integrated circuit including a voltage source and a measurement sensor.

The integrated circuit 110 may be configured to sense a characteristic of the measurement element 112 and use the indicated setting. Referring to FIG. 2, an exemplary integrated circuit 110 may include a sensor circuit 114 adapted to sense the relevant characteristic of the measurement element 112 and generate a corresponding control signal. For example, the sensor circuit 114 may comprise a voltage source 116 and a measurement sensor 118. The voltage source 116 may be adapted to supply a voltage that is independent of the measurement element 112 to the terminal connected to the measurement element 112. The measurement sensor 118 may be responsive to a current in the measurement element 112 and adapted to produce a control signal according to the current, such as by determining a resistance, impedance, or capacitance of the measurement element 112. The control signal may represent the desired setting as indicated by the particular measurement element 112, where each setting is represented by a different value of the measured characteristic in the measurement element 112 and a different control signal generated by the measurement sensor 118. The functional module 108 or other circuit receiving the control signal may then implement the selected setting.

In various systems employing a current source instead of a voltage source, the voltage that appears at the terminal of the integrated circuit 110 is a function of the measurement element 112, such as an external resistor value. In the present embodiment, the voltage on the terminal is substantially independent of the measurement element 112. Further, the current flowing through the measurement element 112 is a function of the external measurement resistor value or other characteristic of the measurement element 112 and may be measured to select one of multiple settings. Accurate DC voltages are easier, such as simpler and/or cheaper, to generate than accurate DC current in integrated circuits, such as when high precision resistors are not available. Precision voltages based on bandgap techniques may be readily created in most integrated circuit fabrication technologies. Further, voltages are generally easier to trim or adjust to achieve high accuracy in the presence of circuit variations related to the manufacturing process. In addition, internal resistance variation can be easily accounted for by adjusting $V_{ref}$.

The sensor circuit 114 facilitates significantly more than two or three states to be selected with a single pin. Embodiments in which eight or sixteen or even more settings could be selected based on an external resistor value are possible. Consequently, a reduced number of pins may be used to select the desired settings.

The voltage source 116 may comprise any suitable source for generating a substantially constant or otherwise controllable voltage, such as to apply a known voltage to the measurement element 112 that is independent of the measurement element 112 characteristics. In one exemplary embodiment, the measurement element 112 comprises an external resistor 120 coupled to the terminal of the integrated circuit 110. The voltage source 116 generates a constant known voltage across the external resistor 120. In one embodiment, the voltage may be selected from common voltages in the environment, such as 1 volt or 5 volts in a microprocessor-based system. The voltage generated by the exemplary voltage source 116 and applied to the terminal is nominally independent of the resistance of the external resistor 120. In another embodiment, the measurement element 112 may comprise a capacitor. The voltage source may deliver a constant known voltage to the capacitor, and the sensor circuit 114 may measure the interval required for the current level in the capacitor to cross a selected threshold.

Figure 3:
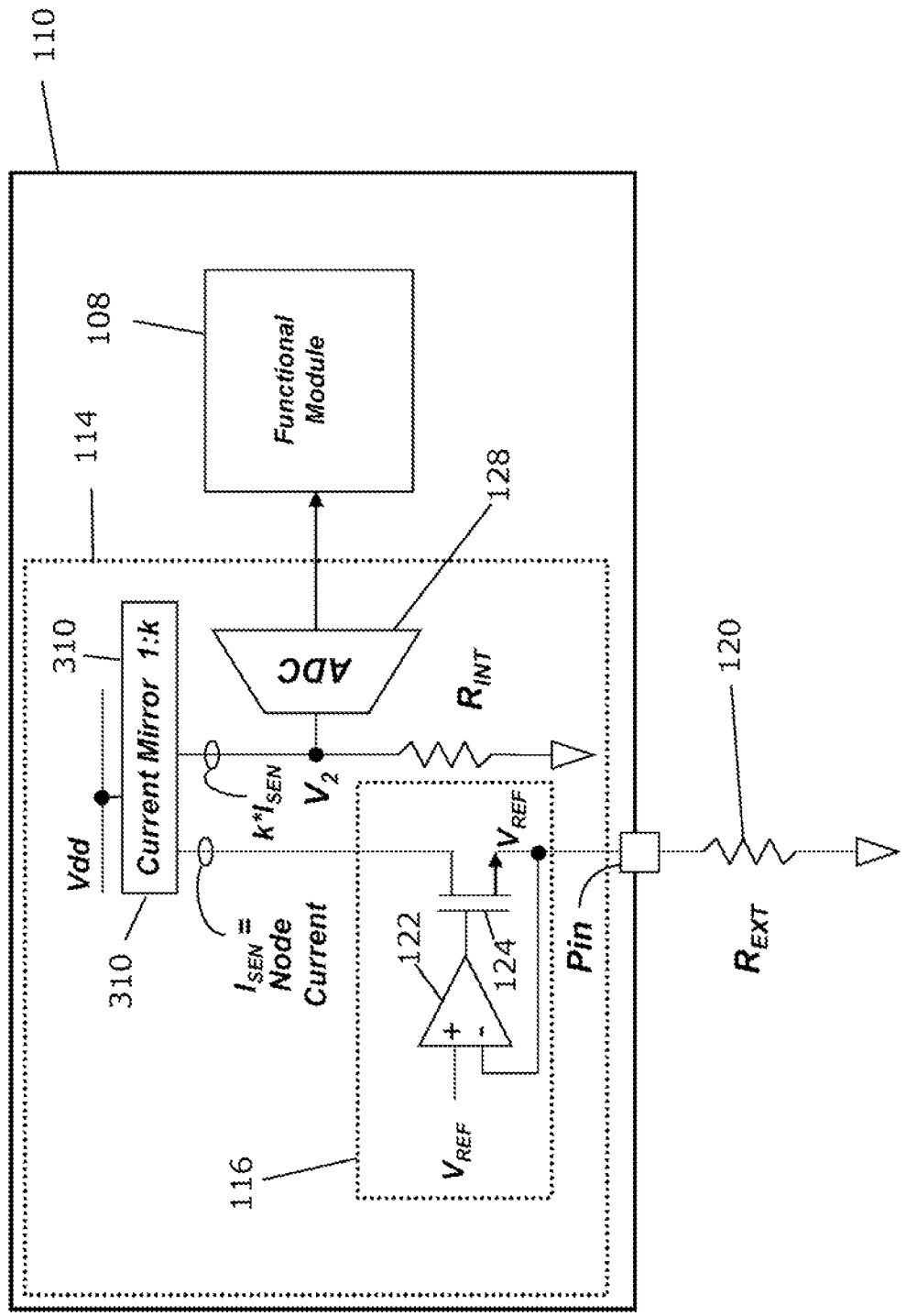
FIG. 3 illustrates an integrated circuit including an exemplary voltage source, an exemplary measurement sensor, and an internal control resistor.

The voltage source 116 may comprise any suitable voltage source for generating a substantially constant and/or independent voltage. For example, referring to FIG. 3, the voltage source 116 may comprise a sensor, such as a conventional operational amplifier (op amp) 122, and a modulator, such as a switch or amplifier for example a conventional MOSFET 124. The op amp 122 receives a reference voltage $V_{ref}$ at a noninverting input and generates an output voltage at an inverting input that is approximately equal to the reference voltage which is also supplied to the external resistor 120. The op amp serves to drive the difference signal between the reference voltage and the output voltage to approximately zero.

The output of the op amp 122 drives the modulator to control the signal applied to the external resistor 120. For example, the gate of the MOSFET 124 may have a terminal connected to the external resistor 120 and a second terminal connected to a relatively high voltage $V_{dd}$. The op amp 122 drives the MOSFET 124 such that the voltage applied to the external resistor 120 is always driven towards the value of the reference voltage $V_{ref}$. Consequently, the voltage at the integrated circuit terminal is approximately equal to $V_{ref}$. The current flowing through the external resistor $R_{ext}$, ($I_{ext}$) is then $V_{ref}/R_{ext}$. Any suitable voltage source, however, may be implemented for applying the desired voltage to the measurement element 112.

The measurement sensor 118 may be responsive to the current in the measurement element 112 and adapted to produce the control signal according to the current. The control signal may represent the desired setting corresponding to one or more relevant characteristics of the particular measurement element 112. The measurement sensor 118 may comprise any suitable sensor for responding to the current in the measurement element 112 and directly or indirectly adjusting the control signal based on the current in the measurement element 112. For example, referring to FIG. 2, the measurement sensor 112 may comprise a current sensor 126 and an analog-to-digital converter (ADC) 128. The current sensor 126 may comprise a conventional current sensor configured to generate an analog electrical signal corresponding to the current in the measurement element 112. In the present embodiment, the current sensor 126 measures the current in series with the external resistor 120 and generates a corresponding analog signal.

The analog signal generated by the current sensor 126 is provided to the ADC 128, which quantizes the analog signal to generate a corresponding digital signal. In the present embodiment, a current flows through the external resistor 120 that is digitized by the ADC 128 to determine a quantized state. The ADC 128 may comprise any appropriate system for generating a digital signal according to an analog signal, such as a conventional ADC. The control signal may comprise the digital output of the ADC 128.

The digital control signal may be provided to any appropriate system for implementing the indicated settings according to the control signal, such as the functional module 108 within the integrated circuit 110 that implements one of the possible settings according to the control signal. In alternative embodiments, the analog signal generated by the current sensor 126 may be provided directly to the functional module 108, for example for functional modules that operate on analog inputs or include an ADC for converting the received signal. In an alternative embodiment, the measurement sensor 118 may comprise a voltage sensor in place of or in addition to the current sensor 126.

The measurement sensor 118 may be configured in any appropriate manner and include any appropriate elements to respond to the current in the measurement element 112 and produce the control signal according to the current. For example, the current sensor 126 may comprise a current mirror adapted to generate a current corresponding to a current in the measurement element 112. In one embodiment, referring, to FIG. 3, the measurement sensor 118 comprises a current mirror 310 coupled to the ADC 128. The current mirror 310 is connected to the MOSFET 124, such as to the drain of the MOSFET 124, such that the current mirror 310 generates an output current having a magnitude corresponding to the magnitude of the drain-source current of the MOSFET 124. The current mirror 310 may exhibit a current transfer function wherein the output current of the current mirror 310 equals k times the input current to the mirror.

In the present embodiment, the output current of the current mirror 310 is provided to an internal control resistor $R_{int}$, forming a voltage across the internal control resistor R. The voltage across the internal control resistor $R_{int}$ is directly proportional to the current flowing through the external resistor 120. In this embodiment, the voltage formed across the internal control resistor $R_{int}$ equals $V_2=V_{ref}*k*R_{int}/R_{ext}$, which is directly proportional to the current flowing through external resistor $R_{ext}$ 120 and can be expressed as $V_2=I_{ext}*k*R_{int}$. The voltage is provided to the ADC 128 to generate the digital control signal, producing a quantized signal to be provided to the functional module 108. The functional module 108 receives the quantized state from the ADC 128 and determines a setting based on the quantized state.

Figure 4:
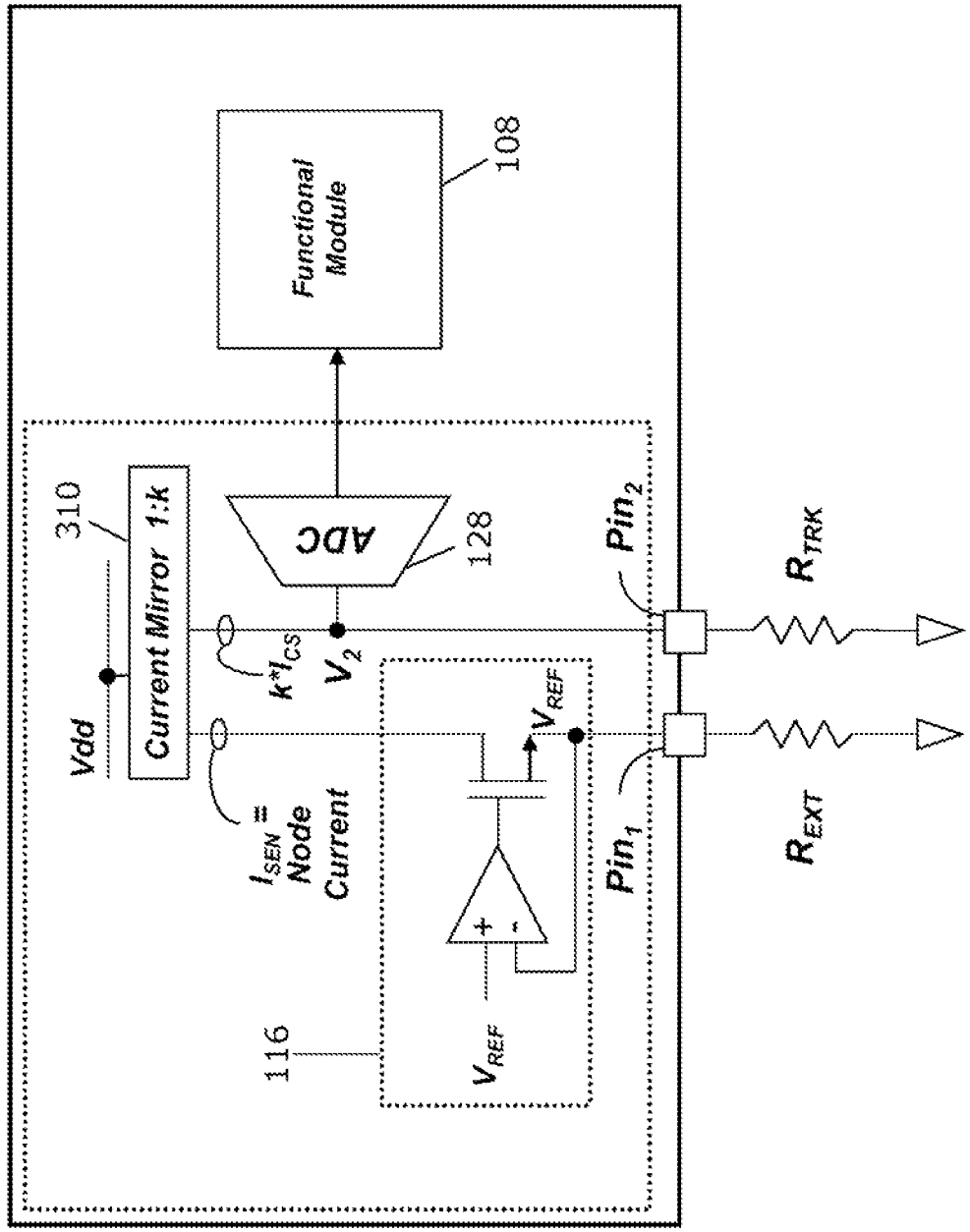
FIG. 4 illustrates an integrated circuit including an external control resistor.

The signal corresponding to the current in the measurement element 112 may be produced in any appropriate manner. For example, referring to FIG. 4, the internal control resistor $R_{int}$ may be replaced or supplemented with an external control resistor $R_{trk}$. In this case, a second terminal has been added to the integrated circuit 110 and the control resistor $R_{trk}$ that forms the voltage $V_2$ provided to the ADC 128 has been placed external to the integrated circuit. In this embodiment, $V_2=I_{ext}*k*R_{trk}$ and is otherwise identical in function to the embodiment of FIG. 3. The external control resistor $R_{trk}$ may have less variation than resistors fabricated directly on the integrated circuit, which may allow greater accuracy and allow more settings to be determined due to the increased accuracy of the sensing circuit 114.

Figure 5:
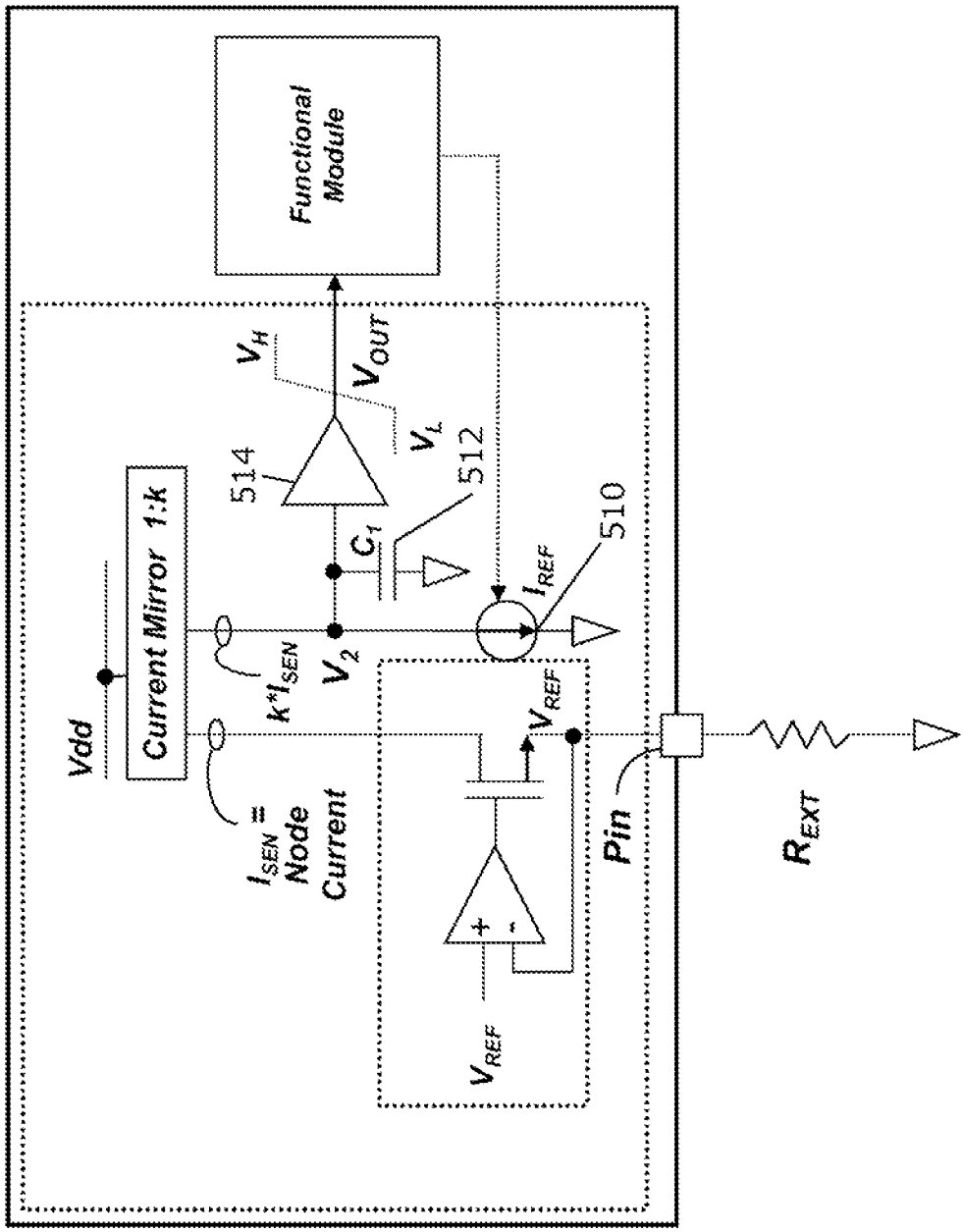
FIG. 5 illustrates an integrated circuit including a measurement sensor comprising a current source, a capacitor, and a buffer.

Further, the control signal may be generated according to the current in the external resistor 120 and/or quantized in any suitable manner. For example, referring to FIG. 5, the measurement sensor 118 may comprise a current source 510, a capacitor 512, and a buffer 514. In this embodiment, the current source 510 and the capacitor 512 may be connected to the node $V_2$. The reference current $I_{ref}$ generated by the current source 510 may be any appropriate current, such as a constant current or a variable current dependent on another variable signal associated with another circuit. The capacitor 512 integrates a difference current between the current generated by the current mirror 310 ($k*I_{sen}$) and the current generated by the current source 510 ($I_{ref}$). The buffer 514 creates a control signal having one of two output states according to whether $k*I_{sen}>I_{ref}$ or $k*I_{sen}<I_{ref}$. The control signal is transmitted to the functional module 108 that determines a setting based on the state information.

Figure 7:
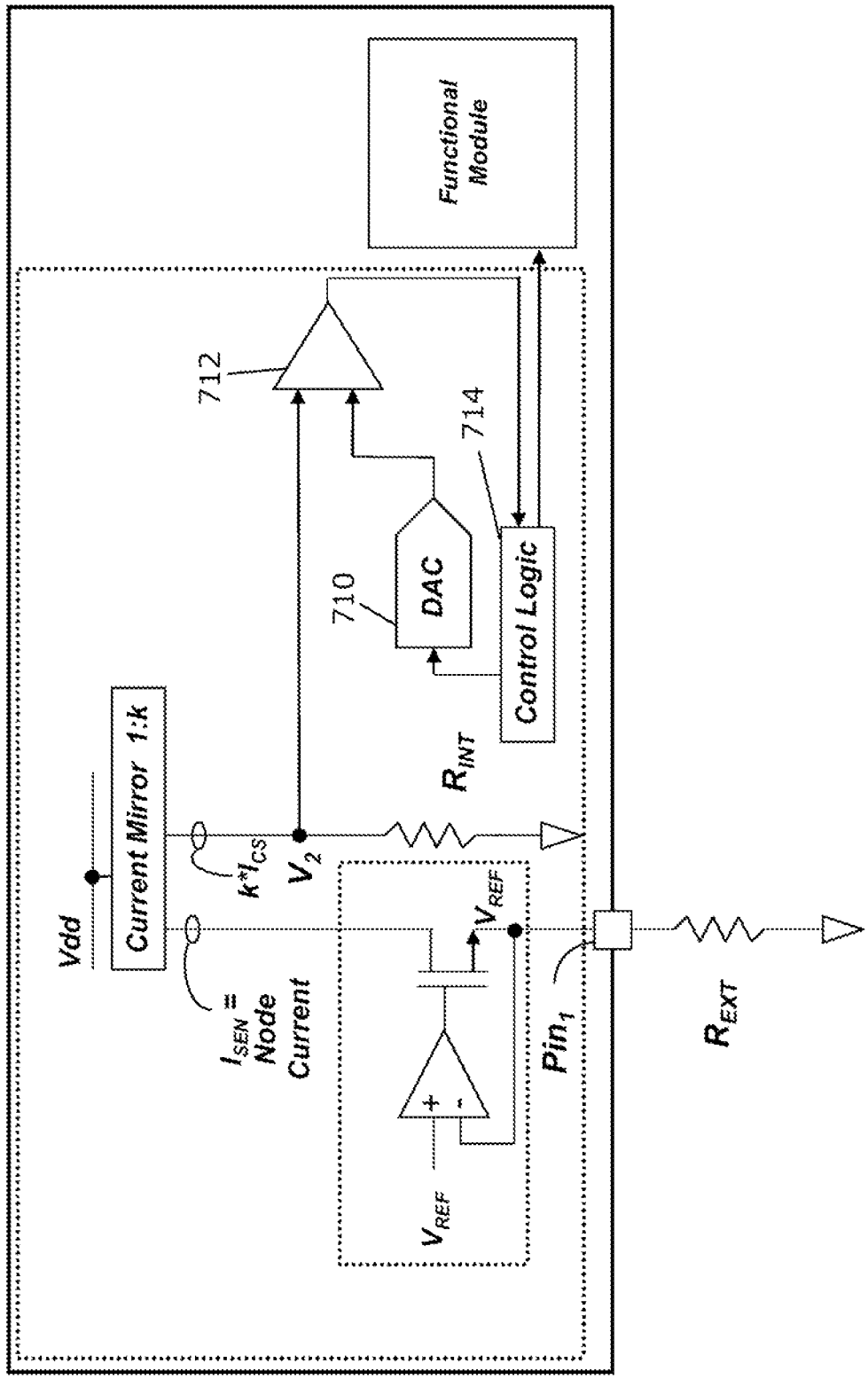
FIG. 7 illustrates an integrated circuit including a measurement sensor comprising a comparator, a digital-to-analog converter, and a control circuit.

In another embodiment, the measurement sensor 118 may measure the current in the external resistor 120 and select a setting according to multiple thresholds or criteria. For example, referring to FIG. 7, the measurement sensor 118 may include a digital-to-analog converter (DAC) 710, a comparator 712, and a control circuit 714. The control circuit 714 may provide selected inputs to the DAC 710, such as by sequentially providing a series of thresholds. The DAC 710 converts the digital input to a corresponding analog signal, which is provided to the input of the comparator 712.

The comparator 712 compares the DAC 710 output to the voltage at node $V_2$. The comparator 712 output may be provided to the control circuit 714, for example to determine which threshold is closest to the voltage at node $V_2$. The control circuit 714 may decode the signal provided to the DAC 710 along with the comparator 712 state to convert a representation of the current flowing through the external resistor 120 (represented by the voltage at node $V_2$) to a specific quantized state. The functional module 108 receives the quantized state from the control circuit 714 and determines a setting based on the quantized state.

Figure 6:
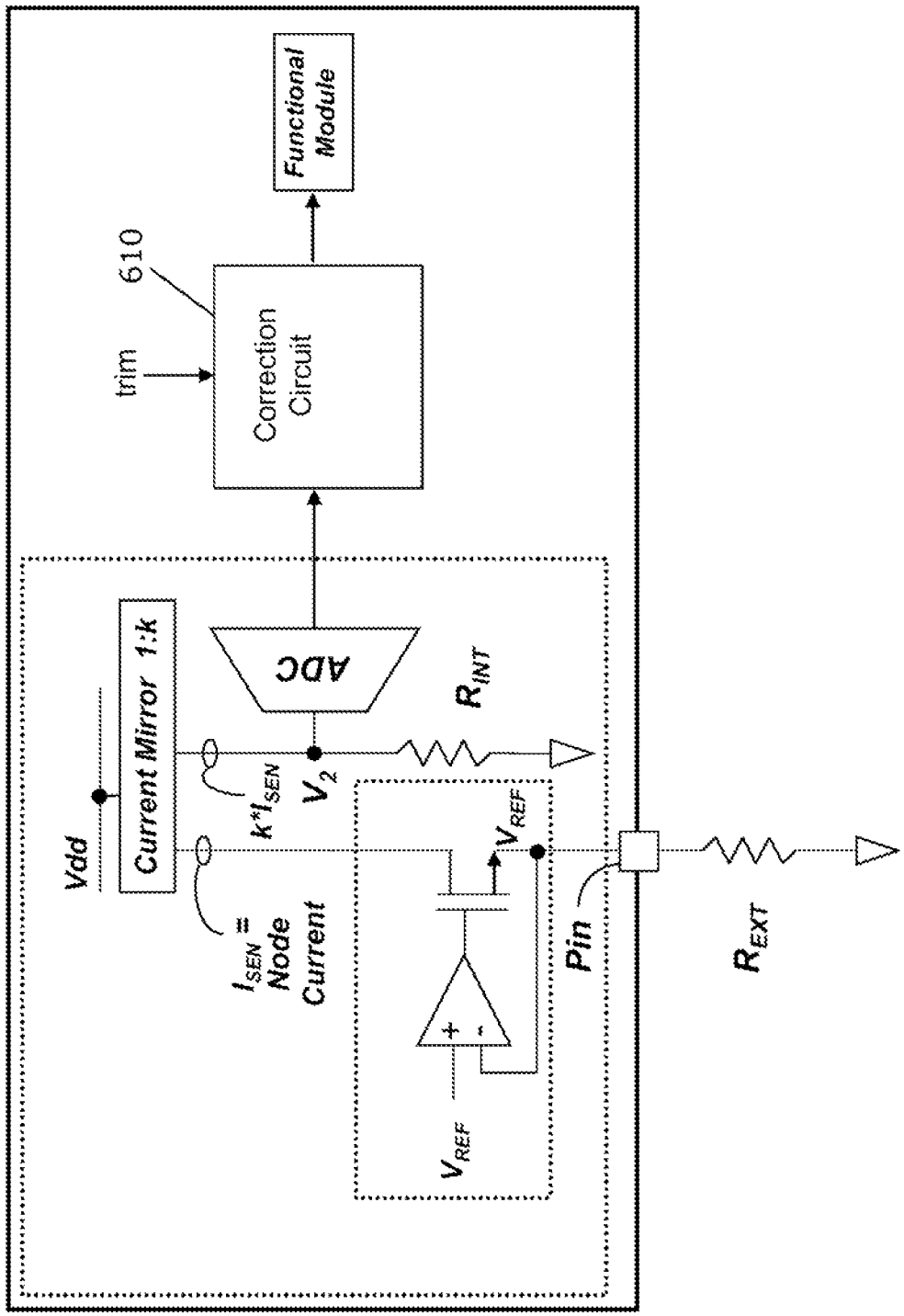
FIGS. 6 and 8 illustrate integrated circuits including correction circuits.

The integrated circuit 110 may comprise any other appropriate components, elements, and systems for selecting the proper setting. For example, the integrated circuit 110 may include a correction circuit to compensate for errors, such as offset and/or gain errors. The correction circuit may trim the output of one or more elements to improve the accuracy of the sensor circuit 114. For example, referring to FIG. 6, the correction function may be implemented by a digital correction circuit 610 that compensates for offset and/or gain errors in the sensor circuit path, inclusive of the ADC 128 function. The digital correction circuit 610 may receive a trim command, which may be stored on the integrated circuit 110 and contains correction terms for offset and/or gain, such as in a look-up table. The correction term(s) for offset and gain may be combined with the output of the ADC 128 to form a corrected output. The corrected output is then used to determine a setting value from multiple setting choices of the functional module 108 with high fidelity in the presence of circuit non-idealities.

Figure 8:
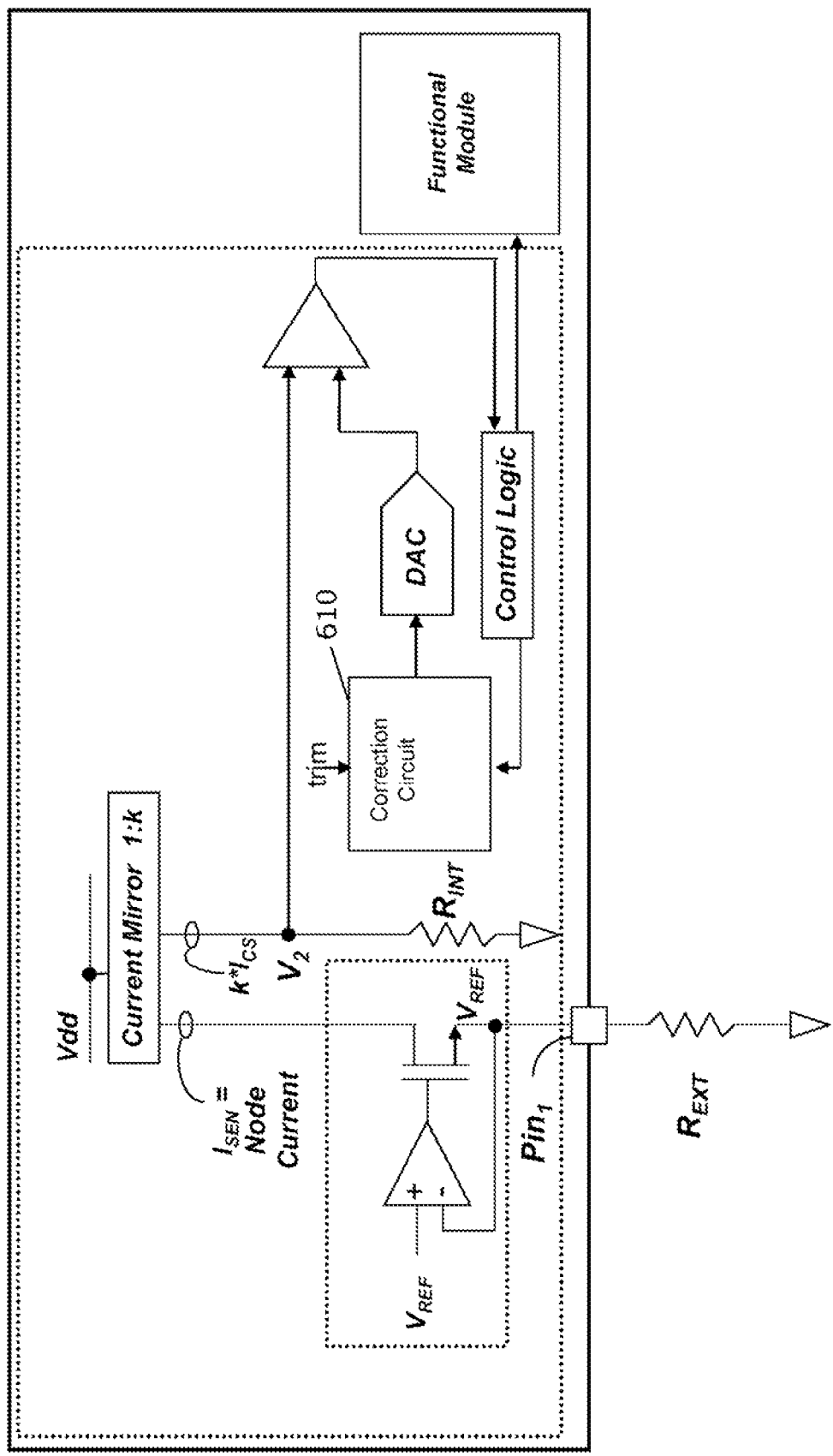

The correction circuit may also be implemented for different types of sensor circuits 114, and may be separate from or partially or fully integrated into the sensor circuit 114. For example, referring to FIG. 8, the digital correction circuit 610 may be implemented in the system shown in FIG. 7. The digital correction circuit 610 may compensate for offset and/or gain errors in the sensor circuit path, including the DAC 710. The correction terms) for offset and/or gain may be combined with the output of the control circuit 714 to form a corrected output. The control circuit 714 may decode the signal provided to the DAC 710 along with the comparator 712 state to convert a representation of the current flowing through the measurement element 112 to a specific quantized state. A correction circuit may correct any appropriate signals. For example, an exemplary correction circuit may trim the input signal $V_{ref}$ that appears at the measurement terminal connected to the measurement element 112 to improve circuit accuracy in the presence of circuit non-idealities such as gain or offset errors.

Figure 9:
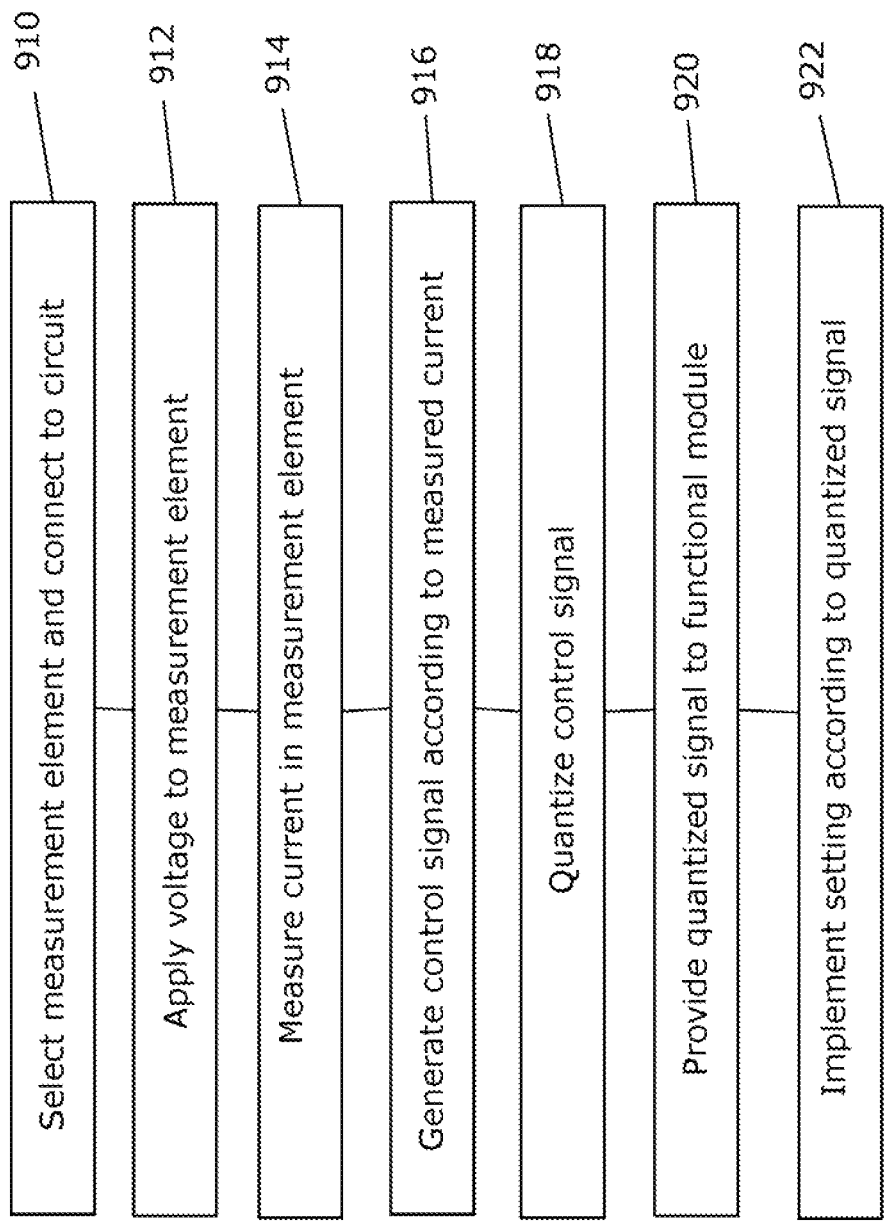
FIG. 9 illustrates an exemplary method for selecting a setting for an integrated circuit.

In operation, referring to FIG. 9, the measurement element 112 may be selected to achieve the desired setting and connected to the integrated circuit 110 (910). The sensor circuit 114 may apply a voltage to the measurement element 112 at the terminal of the integrated circuit 110 (912). The voltage applied to the measurement element 112 at the terminal may be nominally independent of the measurement element's characteristics. The sensor circuit 114 also generates a control signal according to the current flowing in the measurement element 112, the rate at which the current in the measurement element 112 changes, or other characteristic affected by or associated with the measurement element 112. The control signal may be provided to the functional module 108 of the integrated circuit 110 to apply a setting according to the control signal.

For example, in an embodiment where the measurement element 112 is the external resistor 120, the integrated circuit 110 may determine the setting for a particular function according to the external resistor 120. The voltage source 116 may apply a voltage to the external resistor 120 that is independent of the resistance of the external resistor. In the present embodiment, the voltage applied to the external resistor 120 remains constant for any resistance connected to the integrated circuit 110.

The applied voltage generates a current flow in the external resistor 120. The measurement sensor 118 directly or indirectly senses the current in the external resistor 120 (914), such as by measuring the current in a series path of the external resistor 120 or a voltage that is associated with the current, and generates the control signal according to the measured current (916). The control signal may be quantized for processing by the functional module 108 of the integrated circuit 110 to determine the desired setting (918). Each of the settings may be designated by a different value for the control signal, which is ultimately controlled by the resistance selected for the external resistor 120. The quantized control signal may be provided to the function module 108 (920), which may implement the selected setting as represented by the control signal (922).

In the foregoing specification, the invention has been described with reference to specific exemplary embodiments. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described.

For example, the steps recited in any method or process claims may be executed in any order and, unless otherwise noted, are not limited to the specific order presented in the claims. Additionally, the components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

The invention claimed is:

1. An integrated circuit adapted to operate in conjunction with a setting selected from a plurality of settings according to an external measurement element connected to a terminal of the integrated circuit, comprising:
    a voltage source adapted to supply a voltage to the measurement element, wherein the voltage is substantially independent of the measurement element; and
    a measurement sensor:
        responsive to a current in the measurement element; and
        adapted to produce a control signal according to the current,
        wherein the control signal represents the selected setting of the plurality of settings,
    wherein the measurement sensor comprises:
        a current source adapted to generate a reference current;
        a capacitor responsive to the reference current and the current in the measurement element, wherein the capacitor generates an integration signal corresponding to an integrated difference between the current in the measurement element and the reference current; and
        a buffer responsive to the integration signal, wherein the buffer generates a quantized control signal according to the integration signal.

2. An integrated circuit according to claim 1, wherein the voltage source is adapted to supply a substantially constant voltage to the measurement element.

3. An integrated circuit according to claim 1, wherein the voltage source comprises:
    a difference sensor adapted to generate a signal corresponding to a difference between a reference voltage and the voltage supplied to the measurement element; and
    a modulator responsive to the difference sensor signal, wherein the modulator controls the voltage supplied to the measurement element according to the difference sensor signal.

4. An integrated circuit according to claim 1, further comprising a correction circuit, wherein the correction circuit is adapted compensate for at least one of offset errors and gain errors in at least one of the measurement element, the voltage source, and the measurement sensor.

5. A sensor circuit for selecting a function setting from multiple function settings for a component, wherein the function setting is specified according to a resistance of an external resistor connected to the component, comprising:
    a voltage source adapted to supply a substantially constant voltage to the resistor, wherein the constant voltage is substantially independent of the resistance of the external resistor;
    a measurement sensor responsive to a current in the resistor, wherein the measurement sensor generates a control signal according to the magnitude of the current; and
    a correction circuit adapted to compensate for at least one of offset errors and gain errors in at least one of the external resistor, the voltage source, and the measurement sensor.

6. A sensor circuit according to claim 5, wherein the voltage source comprises:
a difference sensor adapted to generate a signal corresponding to a difference between a reference voltage and the voltage supplied to the external resistor; and
a modulator responsive to the difference sensor signal, wherein the modulator controls the voltage supplied to the external resistor according to the difference sensor signal.

7. A sensor circuit according to claim 5, wherein the measurement sensor comprises a current sensor adapted to generate a current sensor signal according to the current in the external resistor.

8. A sensor circuit according to claim 5, wherein the measurement sensor comprises a current mirror adapted to generate a minor current proportional to the current in the external resistor.

9. A sensor circuit according to claim 8, wherein the measurement sensor further comprises:
a control resistor coupled to the current minor, wherein the minor current flows through the control resistor; and
an analog-to-digital converter coupled to the control resistor.

10. A sensor circuit according to claim 9, wherein the control resistor is integrated into the integrated circuit.

11. A sensor circuit according to claim 9, wherein the control resistor is external to the integrated circuit.

12. A sensor circuit according to claim 5, wherein the measurement sensor comprises:
a current source adapted to generate a reference current;
a capacitor responsive to the reference current and the current in the measurement element, wherein the capacitor generates an integration signal corresponding to an integrated difference between the current in the measurement element and the reference current; and
a buffer responsive to the integration signal, wherein the buffer generates a quantized control signal according to the integration signal.

13. A sensor circuit according to claim 5, wherein the measurement sensor comprises:
a comparator responsive to the current in the external resistor, wherein the comparator is adapted to compare the current in the external resistor to multiple thresholds; and
a control circuit adapted to provide the multiple thresholds to the comparator.

14. A method for selecting a setting for an integrated circuit adapted to operate in conjunction with a plurality of settings according to an external measurement element connected to a terminal of the integrated circuit including a functional module, comprising:
applying a substantially constant voltage to the terminal, wherein the voltage is substantially independent of the measurement element;
generating a control signal according to a magnitude of a current in the external measurement element, wherein the control signal corresponds to the setting to be selected for the integrated circuit; and
providing the control signal to the functional module of the integrated circuit, wherein the functional module implements the setting to be selected according to the control signal,
wherein generating the control signal comprises:
generating a reference current;
generating an integration signal corresponding to an integrated difference between the current in the external measurement element and the reference current; and
generating a quantized control signal according to the integration signal.

15. A method according to claim 14, wherein applying the substantially constant voltage to the terminal comprises:
generating a difference signal corresponding to a difference between a reference voltage and the voltage supplied to the measurement element; and
controlling the voltage supplied to the measurement element according to the difference signal.

16. A method according to claim 14, further comprising compensating for at least one of offset errors and gain errors in at least one of the measurement element, the voltage, and the control signal.

17. A method for selecting a setting for an integrated circuit adapted to operate in conjunction with a plurality of settings according to an external measurement element connected to a terminal of the integrated circuit including a functional module, comprising:
applying a substantially constant voltage to the terminal, wherein the voltage is substantially independent of the measurement element;
generating a control signal according to a magnitude of a current in the external measurement element, wherein the control signal corresponds to the setting to be selected for the integrated circuit and is generated by generating multiple thresholds and comparing the current in the measurement element to the multiple thresholds; and
providing the control signal to the functional module of the integrated circuit, wherein the functional module implements the setting to be selected according to the control signal.

* * * * *